US011415632B2

(12) United States Patent
Horii

(10) Patent No.: US 11,415,632 B2
(45) Date of Patent: Aug. 16, 2022

(54) EXECUTION FREQUENCY SETTING DEVICE AND EXECUTION FREQUENCY SETTING SYSTEM

(71) Applicant: ISUZU MOTORS LIMITED, Tokyo (JP)

(72) Inventor: Yuusuke Horii, Fujisawa (JP)

(73) Assignee: ISUZU MOTORS LIMITED, Tokyo (JP)

( * ) Notice: Subject to any disclaimer, the term of this patent is extended or adjusted under 35 U.S.C. 154(b) by 28 days.

(21) Appl. No.: 16/978,880

(22) PCT Filed: Mar. 7, 2019

(86) PCT No.: PCT/JP2019/008994
§ 371 (c)(1),
(2) Date: Sep. 8, 2020

(87) PCT Pub. No.: WO2019/172353
PCT Pub. Date: Sep. 12, 2019

(65) Prior Publication Data
US 2020/0408845 A1    Dec. 31, 2020

(30) Foreign Application Priority Data
Mar. 8, 2018  (JP) .............................. JP2018-041859

(51) Int. Cl.
G01R 31/3835   (2019.01)
B60L 58/22     (2019.01)
H02J 7/00      (2006.01)
H01M 10/44     (2006.01)
H02J 1/14      (2006.01)

(52) U.S. Cl.
CPC .......... *G01R 31/3835* (2019.01); *B60L 58/22* (2019.02); *H01M 10/44* (2013.01); *H02J 1/14* (2013.01); *H02J 7/0048* (2020.01)

(58) Field of Classification Search
CPC .... G01R 31/3835; B60L 58/22; H02J 7/0014; H02J 7/0016; H02J 7/0018; H02J 7/0019; H02J 7/0048; H02J 1/14; H01M 10/44
USPC ....................................................... 320/132
See application file for complete search history.

(56) References Cited

U.S. PATENT DOCUMENTS

2003/0146737 A1   8/2003  Kadouchi et al.
2007/0025135 A1   2/2007  Yamamoto
2012/0215472 A1   8/2012  Tezuka et al.
(Continued)

FOREIGN PATENT DOCUMENTS

JP    2001-136673 A    5/2001
JP    2003219572 A     7/2003
(Continued)

OTHER PUBLICATIONS

International Search Report from International Application No. PCT/JP2019/008994 dated May 28, 2019.

*Primary Examiner* — Nathaniel R Pelton
(74) *Attorney, Agent, or Firm* — Brundidge & Stanger, P.C.

(57) ABSTRACT

This cell balance control device comprises an execution unit that executes cell balance control of a battery having a plurality of battery cells, and an execution condition setting unit that variably sets execution conditions for the cell balance control so that the execution frequency of the cell balance control is increased as the battery deteriorates.

4 Claims, 3 Drawing Sheets

(56) References Cited

U.S. PATENT DOCUMENTS

| | | | |
|---|---|---|---|
| 2015/0244189 A1* | 8/2015 | Baba | H02J 7/00 |
| | | | 320/116 |
| 2016/0218525 A1 | 7/2016 | Takao | |
| 2017/0072803 A1* | 3/2017 | Murai | H02J 7/0014 |

FOREIGN PATENT DOCUMENTS

| | | |
|---|---|---|
| JP | 2007-043788 A | 2/2007 |
| JP | 2010-130798 A | 6/2010 |
| JP | 2011-222343 A | 11/2011 |
| JP | 2013-005677 A | 1/2013 |
| JP | 2017-169366 A | 9/2017 |
| JP | 2018-057129 A | 4/2018 |
| WO | 2015072061 A1 | 5/2015 |
| WO | 2015133401 A1 | 9/2015 |
| WO | 2015072061 A1 | 3/2017 |

* cited by examiner

EXECUTION FREQUENCY SETTING DEVICE AND EXECUTION FREQUENCY SETTING SYSTEM

TECHNICAL FIELD

The present disclosure relates to a cell balance control device and a cell balance control system.

BACKGROUND ART

A battery provided in a vehicle such as an electric vehicle includes a plurality of battery cells. In such a battery, performance as the overall battery may be limited when a voltage value variation of the respective battery cells occurs. Examples thereof include a case where the voltage of a battery cell having a high voltage value reaches an upper limit voltage value of a battery when the battery is charged, and a case where the voltage of a battery cell having a low voltage value reaches a lower limit voltage value of a battery earlier due to discharge or the like when a residual amount of the battery decreases.

To restrain such a voltage value variation of the respective battery cells, it is known that cell balance control to equalize each voltage value of a plurality of battery cells is performed (for example, see Patent Literature (hereinafter, referred to as "PTL") 1). Specifically, in a case where a difference value between a maximum voltage value and a minimum voltage value of the respective battery cells is larger than a threshold value set in advance, the cell balance control is performed by discharging battery cells having a high voltage value.

CITATION LIST

Patent Literature

PTL 1
Japanese Patent Application Laid-Open No. 2013-5677

SUMMARY OF INVENTION

Technical Problem

In the cell balance control, however, energy loss is generated as much as an amount of discharging the battery cells having a high voltage value. Accordingly, the number of executions of the cell balance control is preferably reduced as much as possible from a viewpoint of energy efficiency.

Nevertheless, since internal resistances of the respective battery cells increase as deterioration of a battery progresses, fluctuation amounts of voltage values of the respective battery cells differ between when the deterioration of the battery progresses and when the deterioration of the battery does not progress. For this reason, when the battery is charged and/or discharged, a frequency at which the voltages of the battery cells reach an upper limit voltage value or a lower limit voltage value of the battery fluctuates depending on a deterioration state of the battery.

In the related art, the deterioration state of a battery is not taken into consideration so that the cell balance control is always performed in a case where a variation of the respective battery cells becomes large. As a result, a problem arises that the number of executions of the cell balance control becomes excessive, which further leads to an occurrence of a wasteful energy loss.

An object of the present disclosure is to provide a cell balance control device and a cell balance control system capable of optimizing the number of executions of cell balance control and restraining a wasteful energy loss from occurring.

Solution to Problem

A cell balance control device according to the present disclosure includes:

an execution section that executes cell balance control of a battery including a plurality of battery cells; and an execution condition setting section that variably sets an execution condition of the cell balance control so as to increase an execution frequency of the cell balance control in accordance with deterioration of the battery.

A cell balance control system according to the present disclosure includes:

a battery including a plurality of battery cells;

a cell balance circuit that equalizes voltage values of the plurality of battery cells; and the cell balance control device that executes cell balance control by controlling the cell balance circuit.

Advantageous Effects of Invention

According to the present disclosure, it is possible to optimize the number of executions of cell balance control and to restrain a wasteful energy loss from occurring.

DESCRIPTION OF EMBODIMENTS

Figure 1:
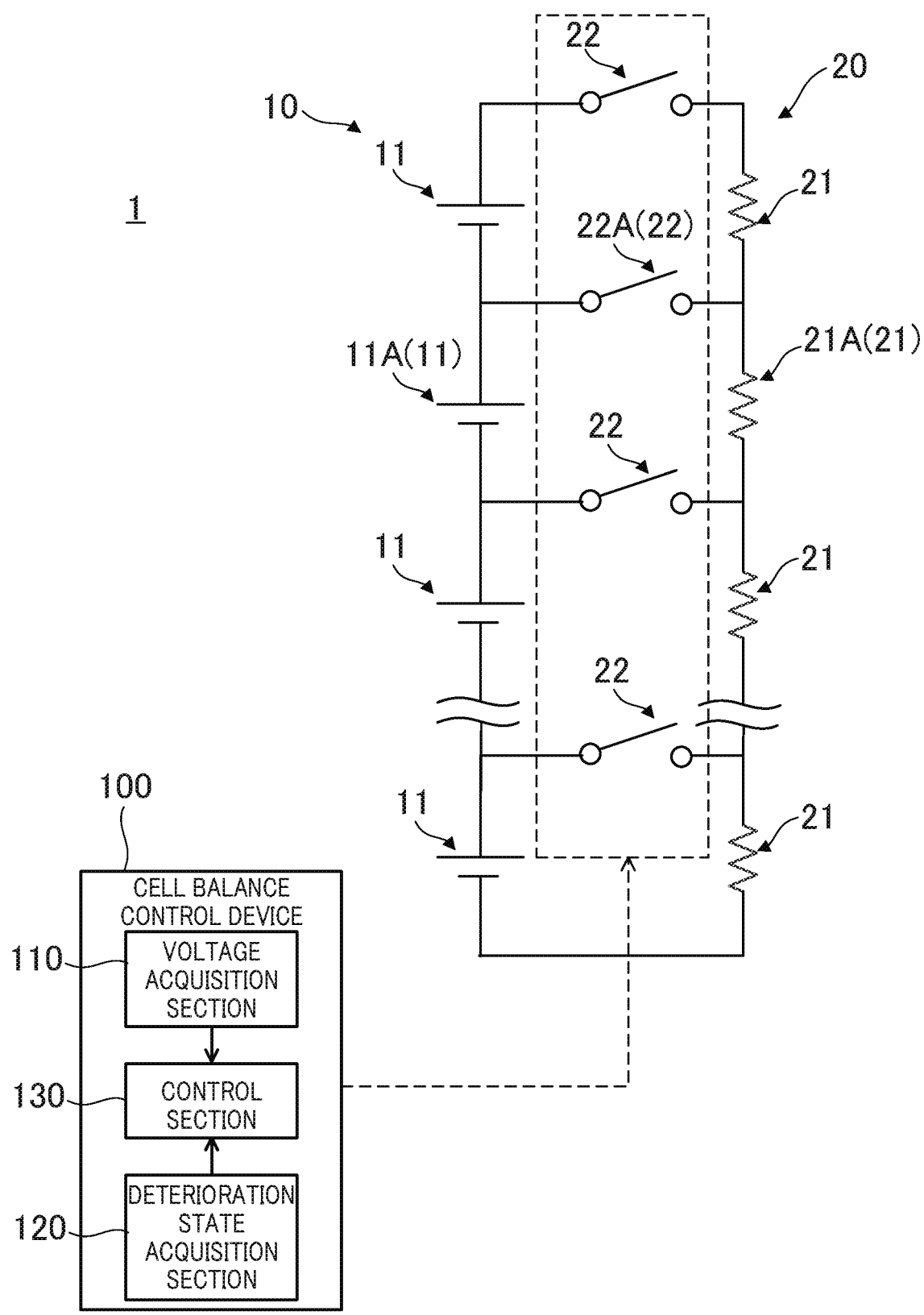
FIG. 1 is a block diagram of a cell balance control system according to an embodiment of the present disclosure.

Hereinafter, an embodiment of the present disclosure will be described in detail with reference to the accompanying drawings. FIG. 1 is a block diagram of cell balance control system 1 according to an embodiment of the present disclosure.

As illustrated in FIG. 1, cell balance control system 1 is a system mounted on a vehicle such as an electric vehicle and a hybrid vehicle, and executes cell balance control of battery 10. Cell balance control system 1 includes battery 10, cell balance circuit 20, and cell balance control device 100.

Battery 10 is a rechargeable battery that is charged by supply of electric power from an external AC power supply or the like, and includes a plurality of battery cells 11 connected in series. Battery cell 11 is, for example, a secondary battery such as a lithium ion battery.

Cell balance circuit 20 is a circuit that equalizes voltage values of the plurality of battery cells 11 of battery 10, and includes a plurality of resistors 21 connected in series, and a plurality of switches 22 provided between battery cells 11 and resistors 21.

Each one of the plurality of switches 22 is provided between an upper end portion of each resistor 21 and a positive electrode portion of each battery cell 11, and is switched between on and off under the control of cell balance control device 100.

When switch 22 is turned on, the voltage of battery cell 11 connected to switch 22 mentioned above is discharged via resistor 21. For example, when battery cell 11A located second from the top is discharged, switch 22A corresponding to battery cell 11A mentioned above is turned on under the control of cell balance control device 100. The voltage of battery cell 11A is discharged via resistor 21A thereby so that, in a case where the voltage value of battery cell 11A is higher than the voltage values of other battery cells 11, the voltage value of battery cell 11A is matched to the voltage values of other battery cells 11. As a result, the voltage values of each battery cell 11 are equalized.

Cell balance control device 100 includes a central processing unit (CPU), a read only memory (ROM), a random access memory (RAM), and an input/output circuit, all of which are not illustrated, and controls each switch 22 of cell balance circuit 20 based on a program set in advance. Thus, cell balance control device 100 executes the cell balance control of battery 10.

Cell balance control device 100 includes voltage acquisition section 110, deterioration state acquisition section 120, and control section 130. Control section 130 corresponds to the "execution section" and the "execution condition setting section" of the present disclosure.

Voltage acquisition section 110 acquires the voltage values of each battery cell 11, and outputs each acquired voltage value to control section 130. Voltage acquisition section 110 may acquire the voltage values of each battery cell 11 directly or via another detection section or the like.

Deterioration state acquisition section 120 acquires a deterioration state of battery 10, and outputs the deterioration state to control section 130. The deterioration state of battery 10 is, for example, a ratio of an internal resistance of battery 10 at a predetermined time to an internal resistance of battery 10 in the initial state. Deterioration state acquisition section 120 is capable of acquiring the deterioration state monitored by another control apparatus or the like.

Control section 130 variably sets an execution condition of the cell balance control so as to increase an execution frequency of the cell balance control in accordance with deterioration of battery 10. Specifically, control section 130 determines a threshold value for executing the cell balance control based on the deterioration state of battery 10. The threshold value is a value used in comparison with an amount of voltage value variation between each battery cell 11, and the amount of voltage value variation is a measured value relating to a voltage of battery 10. The amount of voltage value variation between each battery cell 11 is, for example, a difference value between a maximum voltage value and a minimum voltage value of the respective voltage values.

Specifically, control section 130 reduces the threshold value as the deterioration of battery 10 progresses. In this way, as will be described later, it is possible to set the threshold value in accordance with the deterioration state of battery 10.

Control section 130 executes the cell balance control in accordance with the voltage values of each battery cell 11 and the determined threshold value. For example, control section 130 executes the cell balance control in a case where the difference value between the maximum voltage value and the minimum voltage value of the voltage values of each battery cell 11 is equal to or larger than the threshold value. Specifically, control section 130 controls on/off of each switch 22 so as to match the voltage values of other battery cells 11 to the voltage value of battery cell 11 having the minimum voltage value. Thus, it is possible to execute the cell balance control in accordance with the deterioration state of battery 10.

Figure 2A:
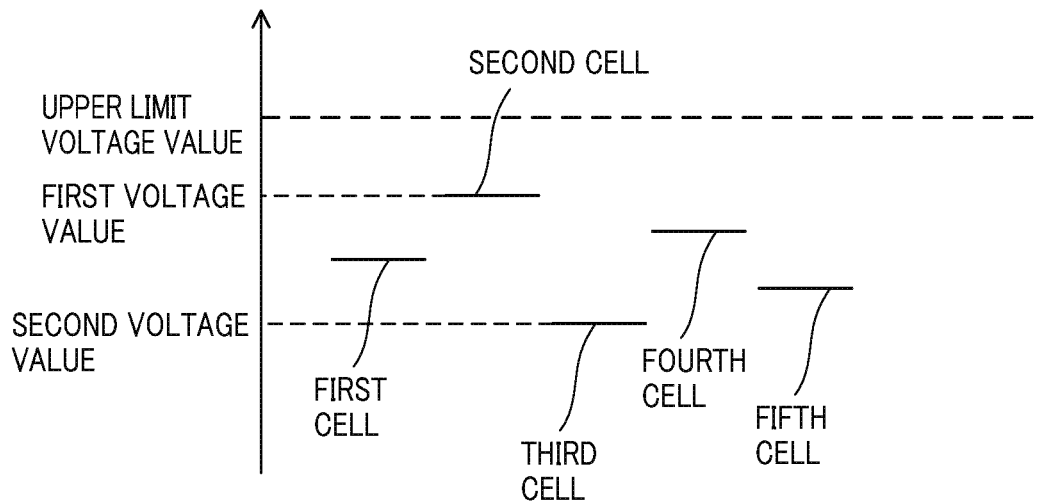
FIG. 2A illustrates voltage values of each battery cell before charging.
Figure 2B:
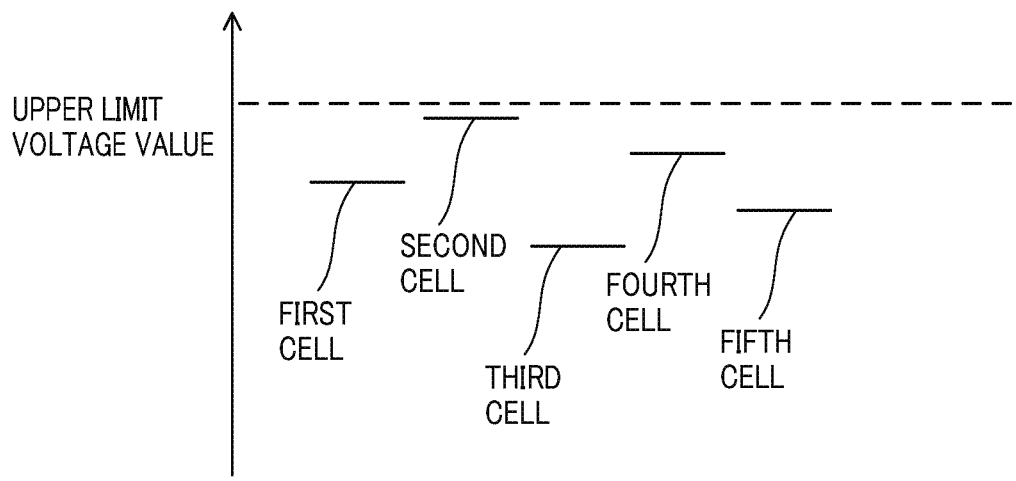
FIG. 2B illustrates voltage values of the respective battery cells after the charging in a state where deterioration of a battery does not progress.
Figure 2C:
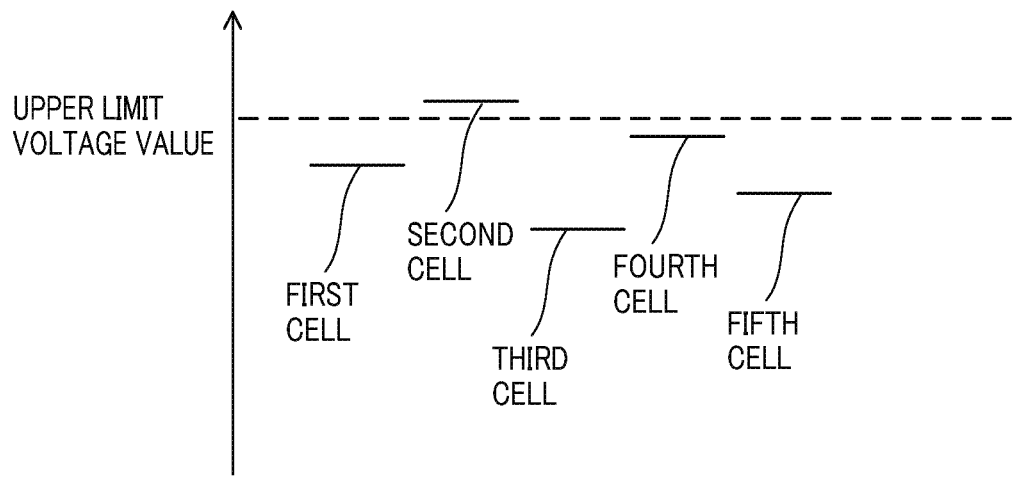
FIG. 2C illustrates voltage values of the respective battery cells after the charging in a state where the deterioration of the battery progresses.

Next, operation of the present embodiment will be described. FIG. 2A illustrates voltage values of each battery cell 11 before charging. FIG. 2B illustrates voltage values of each battery cell 11 after the charging in a state where the deterioration of battery 10 does not progress. FIG. 2C illustrates voltage values of each battery cell 11 after the charging in a state where the deterioration of battery 10 progresses.

Note that, FIGS. 2A to 2C exemplify battery 10 including five battery cells 11 (a first cell, a second cell, a third cell, a fourth cell, and a fifth cell). Further, the vertical axis in FIGS. 2A to 2C indicates the voltage value.

As the deterioration of battery 10 progresses, the internal resistance of battery 10 increases. In a case where the internal resistance of battery 10 is large, the voltage value when the same electric current flows becomes higher than a case where the internal resistance is small, so that fluctuation amounts of the voltage values of each battery cell 11 differ between when the deterioration of battery 10 progresses and when the deterioration of battery 10 does not progress.

Specifically, a frequency at which the voltages of one or some of battery cells 11 of battery 10 reach an upper limit voltage value or a lower limit voltage value set for battery 10 when battery 10 is charged and/or discharged increases as the deterioration of battery 10 progresses. The upper limit voltage value is a voltage value above which charging of battery 10 is overcharging. The lower limit voltage value is a voltage value above which discharging of battery 10 is overdischarging.

As illustrated in FIG. 2A, it is assumed, for example, that the voltage values vary in a range between a first voltage value (the maximum voltage value) and a second voltage value (the minimum voltage value) before charging of battery 10. Further, in FIGS. 2A to 2C, the voltage value of the second cell is the first voltage value, and the voltage value of the third cell is the second voltage value.

In the case of the state where the deterioration of battery 10 does not progress as illustrated in FIG. 2B, it is assumed, for example, that battery 10 is charged only in such a charging amount that the voltage of the second cell having the maximum voltage value does not reach the upper limit voltage value. However, as illustrated in FIG. 2C, even in a case where the charging amount is the same as that in FIG. 2B, the amounts of increases in the voltage values in the state where the deterioration of battery 10 progresses become larger than those in the state of FIG. 2B. This is caused by an increased internal resistance of battery 10. As a result, at least the second cell having the maximum voltage value is highly likely to exceed the upper limit voltage value.

That is, when battery 10 is charged, the frequency at which the voltages of battery cells 11 having a high voltage value reach the upper limit voltage value of battery 10 increases as the deterioration of battery 10 progresses. Note that, even when battery 10 is discharged, the frequency at which the voltages of battery cells 11 having a low voltage value reach the lower limit voltage value of battery 10 similarly increases as the deterioration of battery 10 progresses.

Here, it is assumed that the threshold value for executing the cell balance control is set to a fixed value (for example, a value smaller than the difference value between the first voltage value and the second voltage value). At this time, when the cell balance control is executed, battery cells 11 having a high voltage value are discharged, whereby the voltage value of the second cell is matched to that of the third cell having the minimum voltage value. As a result, even in a case where battery 10 deteriorates as in FIG. 2C when battery 10 is charged, the voltage value of the second cell can be matched to the voltage value of the third cell, so that it is possible to configure that the voltage values of the respective cells do not exceed the upper limit voltage value.

In a case where the deterioration of battery 10 does not progress as in FIG. 2B, on the other hand, the voltage value of any of battery cells 11 does not exceed the upper limit voltage value even when battery 10 is charged. Since energy loss is generated as much as an amount of discharging battery cells 11 having a high voltage value in the cell balance control, the cell balance control is preferably not executed as much as possible from the viewpoint of energy efficiency. However, when the threshold value is set to the fixed value described above, the cell balance control is executed in the same manner as in the case of FIG. 2C.

That is, even in a case where the deterioration of battery 10 does not progress, execution of the cell balance control in the same manner as when the deterioration of battery 10 progresses results in a problem that the number of executions of the cell balance control becomes excessive, which further leads to an occurrence of a wasteful energy loss.

In the present embodiment, the threshold value is reduced as the deterioration of battery 10 progresses. In other words, in the present embodiment, the less the deterioration of battery 10 progresses, the larger the threshold value is. Accordingly, in the case of FIG. 2B, the cell balance control is no longer executed by setting the threshold value so as to be larger than the difference value between the first voltage value and the second voltage value. Thus, the number of executions of the cell balance control is restrained from becoming excessive, which further makes it possible to restrain a wasteful energy loss from occurring.

Note that, as the threshold value, it is possible to use values set in advance for each deterioration state of battery 10. Further, by experiments, simulations, and/or the like, the threshold value can be appropriately set to such a value whereby performance of battery 10 is not limited due to the amount of voltage value variation between each battery cell 11.

Figure 3:
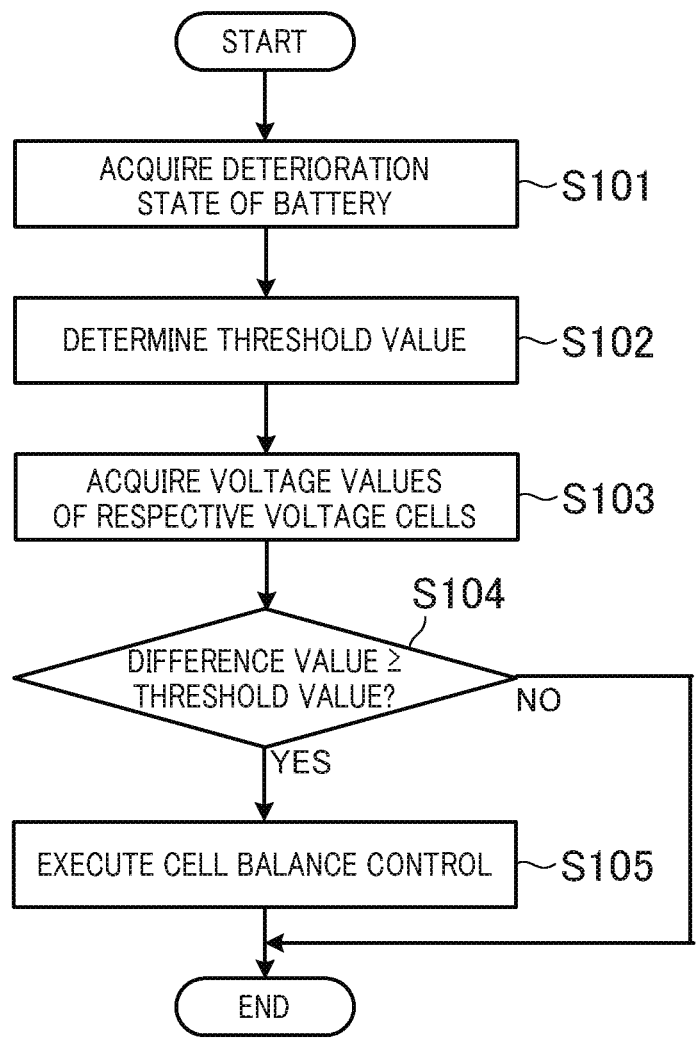
FIG. 3 is a flowchart illustrating an operation example of control by a cell balance control device.

An operation example of control by cell balance control device 100 configured as described above will be described. FIG. 3 is a flowchart illustrating the operation example of the control by cell balance control device 100. Processing in FIG. 3 is executed, for example, when cell balance control system 1 starts operation.

As illustrated in FIG. 3, control section 130 acquires a deterioration state of battery 10 (step S101). Control section 130 then determines a threshold value for executing the cell balance control (step S102). Specifically, control section 130 determines the threshold value such that the threshold value is reduced as the deterioration of battery 10 progresses.

Next, control section 130 acquires voltage values of each battery cell 11 (step S103). Control section 130 then judges whether a difference value between a maximum voltage value and a minimum voltage value of the respective voltage values is equal to or larger than the threshold value (step S104).

As a result of the judgment, in a case where the difference value is less than the threshold value (step S104, NO), the control ends. In a case where the difference value is equal to or larger than the threshold value (step S104, YES), on the other hand, control section 130 executes the cell balance control (step S105). The control ends after the step S105.

Note that, the control may be executed while performing charging/discharging operation of battery 10 or may be executed separately from the charging/discharging operation.

According to the present embodiment configured as described above, the threshold value for executing the cell balance control is determined in accordance with the deterioration state of battery 10 so that the number of executions of the cell balance control can be adjusted depending on the deterioration state of battery 10. As a result, it is possible to optimize the number of executions of the cell balance control and to restrain a wasteful energy loss from occurring.

Further, since the threshold value is set to be reduced as the deterioration of battery 10 progresses, it is possible to set the threshold value in accordance with the deterioration state of battery 10.

Note that, although the embodiment described above has exemplified the execution section and the execution condition setting section as control section 130, the present disclosure is not limited thereto. The execution section and the execution condition setting section may be provided separately.

Further, although cell balance control device 100 acquires the deterioration state of battery 10 by deterioration state acquisition section 120 in the embodiment described above, the present disclosure is not limited thereto. For example, cell balance control device 100 (the execution condition setting section) may variably set the execution condition of the cell balance control based on the internal resistance of battery 10. Further, cell balance control device 100 (the execution condition setting section) may also variably set the execution condition of the cell balance control based on the frequency of reaching the upper limit voltage value or the lower limit voltage value when battery 10 is charged and/or discharged.

Further, although the configuration illustrated in FIG. 1 has been exemplified as the cell balance circuit in the embodiment described above, the present disclosure is not limited thereto. A configuration other than that of FIG. 1 may be employed as the cell balance circuit.

In addition, any of the embodiment described above is only illustration of an exemplary embodiment for implementing the present disclosure, and the technical scope of the present disclosure shall not be construed limitedly thereby. That is, the present disclosure can be implemented in various forms without departing from the gist or the main features thereof.

This application is based upon Japanese Patent Application No. 2018-041859, filed on Mar. 8, 2018, the entire contents of which are incorporated herein by reference.

INDUSTRIAL APPLICABILITY

The cell balance control device of the present disclosure is useful as a cell balance control device and a cell balance control system capable of optimizing the number of executions of cell balance control and restraining a wasteful energy loss from occurring.

REFERENCE SIGNS LIST

1 Cell balance control system
10 Battery
11 Battery cell
20 Cell balance circuit
21 Resistor
22 Switch
100 Cell balance control device
110 Voltage acquisition section
120 Deterioration state acquisition section
130 Control section

What is claimed is:

1. An execution frequency setting device, comprising:
an execution section that executes cell balance control of a battery including a plurality of battery cells; and
an execution condition setting section that variably sets a threshold value which is an execution condition of the cell balance control so as to increase an execution frequency of the cell balance control in accordance with deterioration of the battery, wherein
the threshold value is used in comparison with a measured value,
the measured value is a difference value between a maximum voltage value and a minimum voltage value of voltage values of each of the battery cells,
the execution section executes the cell balance control in a case where the measured value is equal to or larger than the threshold value, and
the execution condition setting section reduces the threshold value as the deterioration of the battery progresses.

2. The execution frequency setting device according to claim 1, wherein
the execution condition setting section variably sets the execution condition of the cell balance control based on an internal resistance of the battery.

3. The execution frequency setting device according to claim 1, wherein
the execution condition setting section variably sets the execution condition of the cell balance control based on a frequency of reaching an upper limit voltage value or a lower limit voltage value when the battery is charged and/or discharged.

4. An execution frequency setting system, comprising:
a battery including a plurality of battery cells;
a cell balance circuit that equalizes voltage values of the plurality of battery cells; and
the execution frequency setting device according to claim 1 that executes cell balance control by controlling the cell balance circuit.

* * * * *